(12) United States Patent
Lippoldt

(10) Patent No.: US 12,372,883 B2
(45) Date of Patent: Jul. 29, 2025

(54) FIELD FACET FOR A FIELD FACET MIRROR OF A PROJECTION EXPOSURE SYSTEM

(71) Applicant: Carl Zeiss SMT GmbH, Oberkochen (DE)

(72) Inventor: Stefan Lippoldt, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 215 days.

(21) Appl. No.: 18/170,928

(22) Filed: Feb. 17, 2023

(65) Prior Publication Data

US 2023/0205099 A1 Jun. 29, 2023

Related U.S. Application Data

(63) Continuation of application No. PCT/EP2021/073180, filed on Aug. 20, 2021.

(30) Foreign Application Priority Data

Sep. 2, 2020 (DE) .......................... 102020211096.4

(51) Int. Cl.
*G03F 7/00* (2006.01)
*G02B 26/08* (2006.01)

(52) U.S. Cl.
CPC ..... *G03F 7/70825* (2013.01); *G02B 26/0858* (2013.01)

(58) Field of Classification Search
CPC ............ G02B 26/0858; G02B 26/0825; G02B 5/0891; G02B 5/09; G03F 7/70825; G03F 7/70075; G03F 7/70266
See application file for complete search history.

(56) References Cited

U.S. PATENT DOCUMENTS

| 6,573,978 B1 | 6/2003 | McGuire, Jr. |
| 6,715,892 B1 | 4/2004 | Carre et al. |

(Continued)

FOREIGN PATENT DOCUMENTS

| DE | 101 51 919 A1 | 5/2003 |
| DE | 10 2008 040 218 A1 | 1/2009 |

(Continued)

OTHER PUBLICATIONS

German Examination Report, with translation thereof, for corresponding DE Appl No. 10 2020 211 096.4, dated Apr. 14, 2021.

(Continued)

*Primary Examiner* — Deoram Persaud
(74) *Attorney, Agent, or Firm* — Fish & Richardson P.C.

(57) ABSTRACT

A field facet for a field facet mirror of a projection exposure apparatus has a reflection surface spanned by two field facet coordinates. An actuator device having at least two independently controllable actuator units serves to deform the reflection surface in at least two independent deformation degrees of freedom. A first of the deformation degrees of freedom brings about a change in a curvature of the reflection surface along a primary curvature coordinate which coincides with one of the field facet coordinates. A second of the deformation degrees of freedom brings about a change in a torsion of the reflection surface about the primary curvature coordinate. This can yield a field facet, the imaging performance of which is optimized, for example adapted to different illumination channel assignments within the projection exposure apparatus.

20 Claims, 12 Drawing Sheets

(56) References Cited

U.S. PATENT DOCUMENTS

| | | | |
|---|---|---|---|
| 10,928,733 B2* | 2/2021 | Patra | G02B 19/0095 |
| 2005/0036196 A1* | 2/2005 | Barnea | G02B 26/0841 |
| | | | 359/291 |
| 2005/0174650 A1* | 8/2005 | Melzer | G03F 7/702 |
| | | | 359/627 |
| 2006/0132747 A1 | 6/2006 | Singer et al. | |
| 2011/0001947 A1* | 1/2011 | Dinger | G02B 26/06 |
| | | | 359/849 |
| 2018/0074303 A1 | 3/2018 | Schwab | |
| 2022/0057717 A1* | 2/2022 | Fischer | G02B 26/101 |
| 2022/0206398 A1* | 6/2022 | Anderl | G03F 7/70075 |
| 2023/0026528 A1* | 1/2023 | Hartjes | G02B 5/0891 |
| 2023/0384685 A1* | 11/2023 | Schmittner | G02B 17/0848 |
| 2024/0012334 A1* | 1/2024 | Raab | G02B 5/09 |
| 2024/0085783 A1* | 3/2024 | Raab | G02B 26/0825 |
| 2024/0085800 A1* | 3/2024 | Pollak | G03F 7/70266 |

FOREIGN PATENT DOCUMENTS

| | | |
|---|---|---|
| DE | 10 2008 009 600 A1 | 8/2009 |
| DE | 10 2013 206 981 A1 | 12/2013 |
| DE | 10 2016 209 847 A1 | 7/2016 |
| DE | 10 2017 221 420 A1 | 11/2018 |
| DE | 10 2018 207 103 A1 | 3/2019 |
| EP | 1 614 008 B1 | 1/2006 |

OTHER PUBLICATIONS

Translation of International Search Report for corresponding PCT Appl No. PCT/EP2021/073180, dated Dec. 14, 2021.

* cited by examiner

FIELD FACET FOR A FIELD FACET MIRROR OF A PROJECTION EXPOSURE SYSTEM

CROSS-REFERENCE TO RELATED APPLICATIONS

The present application is a continuation of, and claims benefit under 35 USC 120 to, international application PCT/EP2021/073180, filed Aug. 20, 2021, which claims benefit under 35 USC 119 of German Application No. 10 2020 211 096.4, filed Sep. 2, 2020. The entire disclosure of these applications are incorporated by reference herein.

FIELD

The disclosure relates to a field facet for a field facet mirror of a projection exposure apparatus. The disclosure furthermore relates to a field facet mirror having at least one such field facet, to a field facet assembly having such a field facet mirror, to an illumination optical unit having such a field facet assembly, to an optical system having such an illumination optical unit, to a projection exposure apparatus having such an optical system, to a method for producing a microstructured or nanostructured component using such a projection exposure apparatus, and to a structured component that has been produced in this manner.

BACKGROUND

A projection exposure apparatus having a field facet mirror that has a plurality of field facets is known from DE 10 2017 221 420 A1. U.S. Pat. No. 6,715,892 B1 discloses embodiments of mirrors with mirror surfaces with a mirror surface that is deformable by an actuator. DE 10 2013 206 981 A1 discloses a facet mirror with mirror facets that are adjustable in terms of radius of curvature. DE 101 51 919 A1 discloses a mirror. DE 10 2008 040 218 A1 discloses a rotatable optical element. DE 10 2018 207 103 A1 discloses a field facet mirror.

SUMMARY

The present disclosure seeks to further develop a field facet of the type set forth at the outset, in such a way that an imaging performance of the field facet is optimized, for example adapted to different illumination channel assignments within the projection exposure apparatus.

The disclosure provides a field facet for a field facet mirror of a projection exposure apparatus,
 having a reflection surface, which is spanned by two field facet coordinates, for reflecting illumination light,
 having an actuator device having at least two independently controllable actuator units for deforming the reflection surface in at least two independent deformation degrees of freedom,
 a first of the deformation degrees of freedom bringing about a change in a curvature of the reflection surface along a primary curvature coordinate which coincides with one of the field facet coordinates,
 a second of the deformation degrees of freedom bringing about a change in a torsion of the reflection surface about the primary curvature coordinate.

According to the disclosure, it was recognized that, in addition to at least one curvature degree of freedom, a torsion degree of freedom can also be used to deform a reflection surface of the field facet in order to optimize its imaging performance. This can be brought about, for example, in a manner adapted to an illumination channel assignment of this field facet, which in turn may be dependent on an illumination setting of the projection exposure apparatus, that is to say may be dependent on a chosen illumination angle distribution. For example, it was recognized that the imaging performance depends on a torsion of the reflection surface of the field facet for the case, relevant in practice, of a three-dimensional arrangement of the illumination channel which runs via the respective field facet in question. In the case of such a three-dimensional position, the illumination channel does not run within a plane. Alternatively or additionally, another case relevant in practice may occur, in which the respective illumination channel planes are different from one another, that is to say extend at an angle with respect to one another for example, even if the positions of the illumination channels, in each case as a profile, can be described as at least approximately within a plane. The torsion degree of freedom, which is independent of a curvature degree of freedom, makes it possible for example to minimize an imaging aberration when imaging a light source or an intermediate focus downstream of the light source via the field facet onto a pupil facet of a pupil facet mirror of an illumination optical unit of the projection exposure apparatus. This may result in relatively small light source images in a pupil plane of the illumination optical unit and, for example, a relatively low degree of pupil filling in an illumination setting. It is possible to ensure that light is not undesirably lost, which can be helpful when using the field facet as a constituent part of an EUV projection exposure apparatus.

The field facet can be embodied with a monolithic reflection surface. In this case, the field facet is not subdivided into a plurality of individual facet reflection sections that are separate from one another.

An edge contour of the reflection surface of the field facet may be rectangular or curved. An aspect ratio of the field facet between an extent of the reflection surface along the primary curvature coordinate and an extent of the reflection surface along the field facet coordinates perpendicular thereto can be greater than 5, can be greater than 8, and can also be greater than 10. This aspect ratio is regularly less than 50.

The actuator device can comprise a further independently controllable actuator unit for deforming the reflection surface in at least a third, independent deformation degree of freedom. The third deformation degree of freedom can bring about a change in a curvature of the reflection surface along a perpendicular curvature coordinate which is perpendicular to the primary curvature coordinate and coincides with the other of the two field facet coordinates. Such embodiments can enable further imaging optimization of the field facet. An independent curvature deformation of the reflection surface along the two field facet coordinates is then possible.

In some embodiments, at least one of the actuator units is supported firstly on a back side of a facet base body of the field facet and secondly on a frame plate of a frame of the field facet, the frame plate being arranged at a distance from a back side of the base body. A central support body is arranged between the base body and the frame plate in the region of a center of the reflection surface, the base body being securely connected to the frame plate via the central support body. Such embodiments can facilitate a defined torsional deformation of the reflection surface, since a positioning of the reflection surface level with the central support body is specified in a defined manner. Torsional forces can then be generated, for example, by actuator units with tensile and/or shear forces perpendicular to the reflection surface of the field facet. The central support body can be embodied as a support web or as a support wall. The central support body can have a rigid embodiment. The support web can be embodied in the form of a strut.

In some embodiments, at least one of the actuator units is supported between a back-side central web of a facet base body of the field facet and a back-side edge web of the base body. Such embodiments can facilitate the introduction of torsional forces into the reflection surface of the field facet. This torsional force introduction can be implemented, for example, by actuator units whose shear and/or tensile forces act parallel to the reflection surface.

In some embodiments, at least one of the actuator units of the actuator device is designed as a piezo-element and/or as a voice coil. Such a piezo-element can be embodied in the form of a piezo-stack. Corresponding piezo-actuators are described in DE 10 2016 209 847 A1. Embodiments which are used in sound transducers, for example, can be used for a voice coil. In this case, a static voltage can be induced instead of a dynamic voltage.

In some embodiments, at least one of the actuator units of the actuator device is designed as a push and/or pull actuator and/or as a shear actuator. A main force direction of an actuator unit in such embodiments can be directed parallel to the reflection surface of the field facet, obliquely to the reflection surface of the field facet and/or perpendicular to the reflection surface of the field facet. An embodiment as a shear actuator can lead to an actuator device involving little constructional outlay.

Alternatively or additionally, other embodiments of magnetostrictive actuators, electrostatic actuators, thermal actuators, or electromagnetic actuators can also be used.

In some embodiments, at least four actuator units of the actuator device are arranged in the form of a 2×2 matrix on the back side of the field facet, that is to say behind the reflection surface. Such embodiments can enable a comparatively simple deformation of the reflection surface in at least two mutually independent deformation degrees of freedom.

In some embodiments, A field facet mirror has at least one field facet as disclosed herein. In some embodiments, a field facet assembly has such a field facet mirror and an open-loop/closed-loop control device which is signal-connected to the actuator device of the field facet respectively having this in each case. Features of such a field facet mirror and of such a field facet mirror assembly can correspond to those which have already been explained above with reference to the field facet according to the disclosure. The open-loop/closed-loop control device of the field facet assembly can be signal-connected to a specification unit for the respectively selected illumination setting.

Features of an illumination optical unit as disclosed herein, of an optical system as disclosed herein, of an illumination optical unit or an optical system as disclosed herein, of a projection exposure apparatus as disclosed herein, of a production method as disclosed herein, and of a microstructured or nanostructured component as disclosed herein can correspond to those which have already been explained above with reference to the field facet according to the disclosure or the field facet mirror assembly according to the disclosure.

The illumination optical unit or the optical system can realize a degree of pupil filling (percentage of illuminated sections of a pupil in a total area of a utilized pupil) of less than 30%, of less than 25%, of less than 20%, and, for example, of less than 15%.

The light source can be an EUV light source. The light source can be a laser plasma source. The light source can have an illumination light used power of more than 500 W and also of more than 800 W.

For example, a semiconductor component, for example a memory chip or a chip for processing data, can be produced using the projection exposure apparatus.

BRIEF DESCRIPTION OF THE DRAWINGS

Below, at least one exemplary embodiment of the disclosure is described on the basis of the drawings, in which.

DETAILED DESCRIPTION

Figure 1:
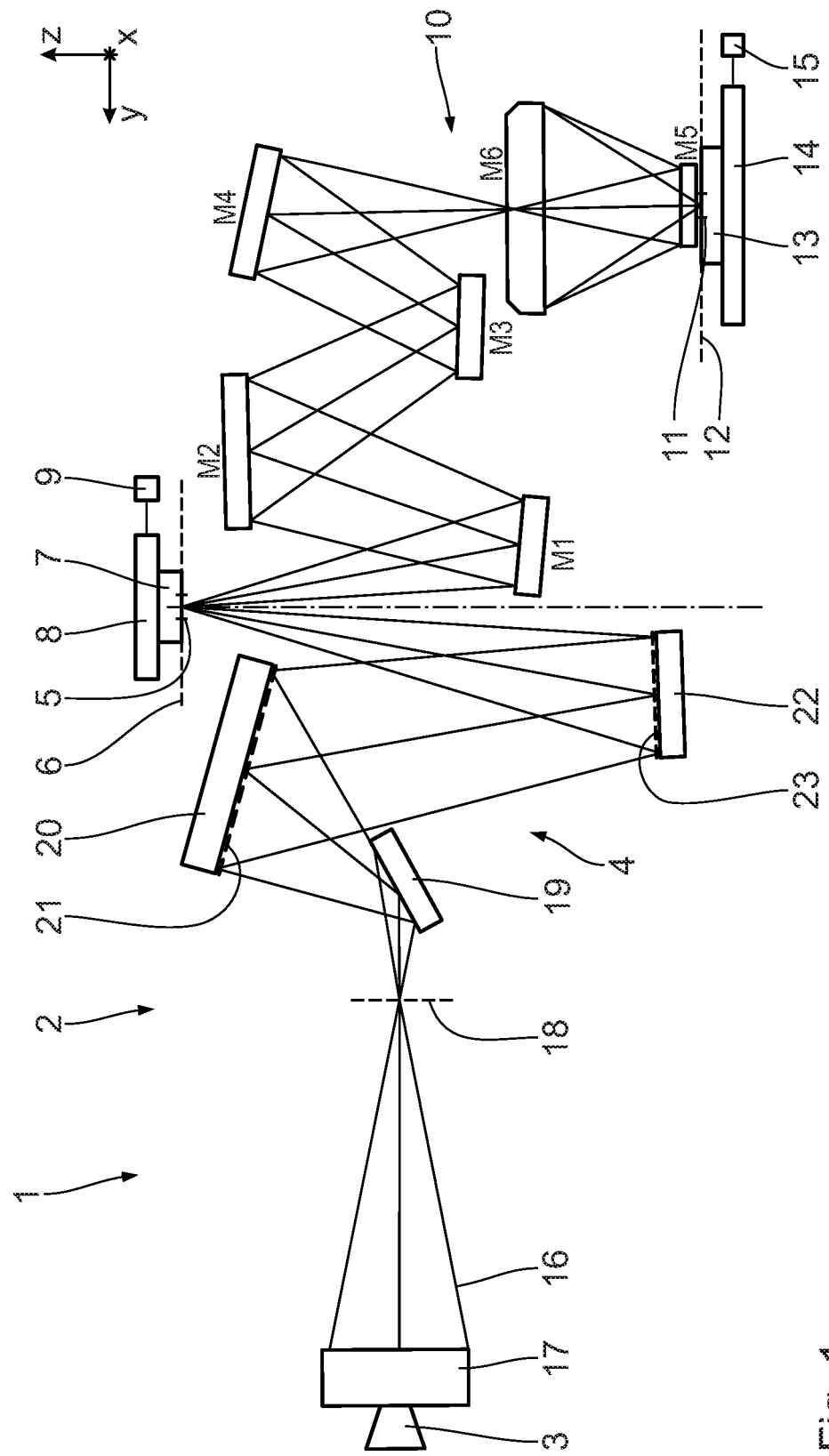
FIG. 1 schematically shows a meridional section of a projection exposure apparatus for EUV projection lithography.

Certain integral parts of a microlithographic projection exposure apparatus 1 are described in exemplary fashion below initially with reference to FIG. 1. The description of the basic structure of the projection exposure apparatus 1 and its constituent parts should not be construed as limiting here.

An illumination system 2 of the projection exposure apparatus 1, as well as a radiation source 3, has an illumination optical unit 4 for illumination of an object field 5 in an object plane 6. What is exposed here is a reticle 7 disposed in the object field 5. The reticle 7 is held by a reticle holder 8. The reticle holder 8 is displaceable by way of a reticle displacement drive 9, for example in a scanning direction.

A Cartesian xyz-coordinate system is shown in FIG. 1 for explanation purposes. The x-direction runs perpendicular to the plane of the drawing into the latter. The y-direction runs horizontally and the z-direction runs vertically. The scanning direction runs in the y-direction in FIG. 1. The z-direction runs perpendicular to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle that differs from 0° is also possible between the object plane 6 and the image plane 12.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15 for example in the y-direction. The displacement, firstly, of the reticle 7 by way of the reticle displacement drive 9 and, secondly, of the wafer 13 by way of the wafer displacement drive 15 can be implemented so as to be synchronized with one another.

The radiation source 3 is an EUV radiation source. The radiation source 3 emits EUV radiation 16 for example, which is also referred to below as used radiation or illumination radiation. For example, the used radiation has a wavelength in the range of between 5 nm and 30 nm. The radiation source 3 may be a plasma source, for example an LPP ("laser produced plasma") source or a GDPP ("gas discharged produced plasma") source. It may also be a synchrotron-based radiation source. The radiation source 3 may be a free electron laser (FEL).

The illumination radiation 16 emerging from the radiation source 3 is focused by a collector 17. The collector 17 may be a collector with one or more ellipsoidal and/or hyperboloidal reflection surfaces. The illumination radiation 16 can be incident on the at least one reflection surface of the collector 11 with grazing incidence (GI), that is to say at angles of incidence of greater than 45°, or with normal incidence (NI), that is to say at angles of incidence of less than 45°. The collector 11 may be structured and/or coated on the one hand for optimizing its reflectivity for the used radiation and on the other hand for suppressing extraneous light.

Downstream of the collector 17, the illumination radiation 16 propagates through an intermediate focus IF in an intermediate focal plane 18. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 may be a plane deflection mirror or, alternatively, a mirror with a beam-influencing effect that goes beyond the purely deflecting effect. As an alternative or in addition thereto, the mirror 19 can be embodied as a spectral filter separating a used light wavelength of the illumination radiation 16 from extraneous light having a wavelength that deviates therefrom. If the first facet mirror 20 is arranged in a plane of the illumination optical unit 4 which is optically conjugate to the object plane 6 as a field plane, this facet mirror is also referred to as a field facet mirror. The first facet mirror 20 comprises a multiplicity of individual first facets 21, which are also referred to below as field facets. FIG. 1 depicts only some of the facets 21 by way of example.

The first facets 21 can be in the form of macroscopic facets, for example in the form of rectangular facets or in the form of facets with an arcuate peripheral contour or a peripheral contour of part of a circle. The first facets 21 can be embodied as monolithic facets.

In a force-free initial state, the first facets 21 may be embodied as plane facets or alternatively as convexly or concavely curved facets.

As is known from DE 10 2008 009 600 A1, for example, at least some of the first facets 21 themselves may also each be composed of a multiplicity of individual mirrors, for example a multiplicity of micromirrors. The first facet mirror 20 may for example be formed as a microelectromechanical system (MEMS system). For details, reference is made to DE 10 2008 009 600 A1.

The illumination radiation 16 travels horizontally, that is to say in the y-direction, between the collector 17 and the deflection mirror 19.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 may also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular or else hexagonal boundary, or may alternatively be facets composed of micromirrors. In this regard, reference is likewise made to DE 10 2008 009 600 A1.

The second facets 23 may have plane reflection surfaces or alternatively reflection surfaces with convex or concave curvature.

The illumination optical unit 4 consequently forms a doubly faceted system. This basic principle is also referred to as a fly's eye integrator or honeycomb condenser.

It may be desirable to arrange the second facet mirror 22 not exactly in a plane that is optically conjugate to a pupil plane of the projection optical unit 7.

With the aid of the second facet mirror 22, the individual first facets 21 are imaged into the object field 5. The second facet mirror 22 is the last beam-shaping mirror or actually the last mirror for the illumination radiation 16 in the beam path upstream of the object field 5.

In an embodiment, not shown, of the illumination optical unit 4, a transfer optical unit contributing for example to the imaging of the first facets 21 into the object field 5 may be arranged in the beam path between the second facet mirror 22 and the object field 5.

The transfer optical unit may have exactly one mirror, or alternatively have two or more mirrors, which are arranged one behind the other in the beam path of the illumination optical unit 4. The transfer optical unit can for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20 and the pupil facet mirror 22.

The deflection mirror 19 can also be dispensed with in a further embodiment of the illumination optical unit 4, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, as a rule, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a passage opening for the illumination radiation 16. The projection optical unit 10 is a double-obscured optical unit. The projection optical unit 10 has an image-side numerical aperture which is greater than 0.5 and which may also be greater than 0.6 and, for example, can be 0.7 or 0.75.

Reflection surfaces of the mirrors Mi may be embodied as free-form surfaces without an axis of rotational symmetry. Alternatively, the reflection surfaces of the mirrors Mi may be designed as aspheric surfaces with exactly one axis of rotational symmetry of the reflection surface shape. Just like the mirrors of the illumination optical unit 4, the mirrors Mi may have highly reflective coatings for the illumination radiation 16. These coatings may be designed as multilayer coatings, for example with alternating layers of molybdenum and silicon.

The projection optical unit 10 has a large object-image offset in the y-direction between a y-coordinate of a center of the object field 5 and a y-coordinate of the center of the image field 11. This object-image offset in the y-direction can be of approximately the same magnitude as a z-distance between the object plane 6 and the image plane 12.

For example, the projection optical unit 10 can have an anamorphic embodiment. For example, it has different imaging scales $\beta_x$, $\beta_y$ in the x- and y-directions. The two imaging scales $\beta_x$, $\beta_y$ of the projection optical unit 7 can be at ($\beta_x$, $\beta_y$)=(+/−0.25,/+−0.125). A positive imaging scale β means imaging without image inversion. A negative sign for the imaging scale β means imaging with image inversion.

The projection optical unit 7 consequently leads to a reduction in size with a ratio of 4:1 in the x-direction, that is to say in a direction perpendicular to the scanning direction.

The projection optical unit 10 leads to a reduction in size of 8:1 in the y-direction, that is to say in the scanning direction.

Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 can be the same or, depending on the embodiment of the projection optical unit 10, can differ. Examples of projection optical units with different numbers of such intermediate images in the x- and y-directions are known from US 2018/0074303 A1.

In each case one of the pupil facets 23 is assigned to exactly one of the field facets 21 for forming in each case an illumination channel for illuminating the object field 5. For example, this can yield illumination according to the Köhler principle. The far field is decomposed into a multiplicity of object fields 5 with the aid of the field facets 21. The field facets 21 generate a plurality of images of the intermediate focus on the pupil facets 23 respectively assigned thereto.

By way of an assigned pupil facet 23, the field facets 21 are imaged in each case onto the reticle 7 in a manner superposed on one another for the purposes of illuminating the object field 5. The illumination of the object field 5 is for example as homogeneous as possible. It can have a uniformity error of less than 2%. The field uniformity may be achieved by way of the overlay of different illumination channels.

The illumination of the entrance pupil of the projection optical unit 10 can be defined geometrically by way of an arrangement of the pupil facets. The intensity distribution in the entrance pupil of the projection optical unit 10 can be set by selecting the illumination channels, for example the subset of the pupil facets which guide light. This intensity distribution is also referred to as illumination setting.

A pupil uniformity in the region of sections of an illumination pupil of the illumination optical unit 4 that are illuminated in a defined manner can be achieved by a redistribution of the illumination channels.

Further aspects and details of the illumination of the object field 5 and for example of the entrance pupil of the projection optical unit 10 are described below.

The projection optical unit 10 may have for example a homocentric entrance pupil. The latter may be accessible. It may also be inaccessible.

The entrance pupil of the projection optical unit 10 regularly cannot be exactly illuminated using the pupil facet mirror 22. In the case of imaging of the projection optical unit 10 which telecentrically images the center of the pupil facet mirror 22 onto the wafer 13, the aperture rays often do not intersect at a single point. However, it is possible to find an area in which the distance of the aperture rays determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component part of the transfer optical unit, should be provided between the second facet mirror 22 and the reticle 7. With the aid of this optical element, the different poses of the tangential entrance pupil and the sagittal entrance pupil may be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged such that it is tilted with respect to the object plane 5. The first facet mirror 20 is arranged in tilted fashion with respect to an arrangement plane defined by the deflection mirror 19.

The first facet mirror 20 is arranged so as to be tilted with respect to an arrangement plane defined by the second facet mirror 22.

Figure 2:
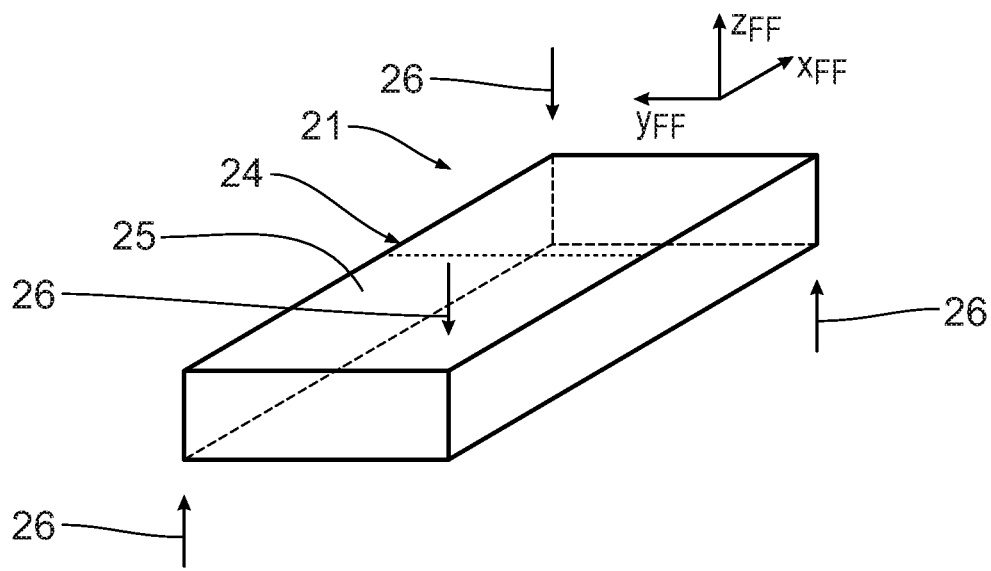
FIG. 2 schematically shows a base body of a field facet of a field facet mirror of the projection exposure apparatus, with emphasis on force application points for generating a torsion of a reflection surface of the field facet.

FIG. 2 schematically shows a cuboid base body 24 of one of the field facets 21 of the field facet mirror 20.

A reflection surface 25 of the field facet 21 is formed on an upper side of the base body 24. To this end, the base body 24 is coated with a multilayer coating (not shown in detail) which is designed to be highly reflective for the incident EUV radiation. The multilayer coating, in turn, can be designed with alternating layers of molybdenum and silicon.

In the embodiment of the field facet 21 according to FIG. 2, the reflection surface 25 has a rectangular edge contour.

The reflection surface 25 is spanned by two field facet coordinates $x_{FF}$, $y_{FF}$, the relationship of which to the field coordinates x, y, for example, is explained below. The field facet coordinate $x_{FF}$ runs along a long side of the rectangular reflection surface 25. The field facet coordinate $y_{FF}$ runs along a short side of the rectangular reflection surface 25. The field facet coordinate $x_{FF}$ along the long side of the edge contour of the field facet 21 is also referred to as the primary curvature coordinate below. The field facet coordinate $y_{FF}$ along the short side of the edge contour of the field facet 21 is also referred to as the perpendicular curvature coordinate below.

In FIG. 2, arrows 26 are used to illustrate force application vectors for deforming the reflection surface 25 in a deformation degree of freedom, specifically for generating or changing a torsion $\kappa_M$ of the reflection surface 25. The force application vectors 26 act in pairs from above and below at opposite diagonal corner points on the base body 24.

Figure 3:
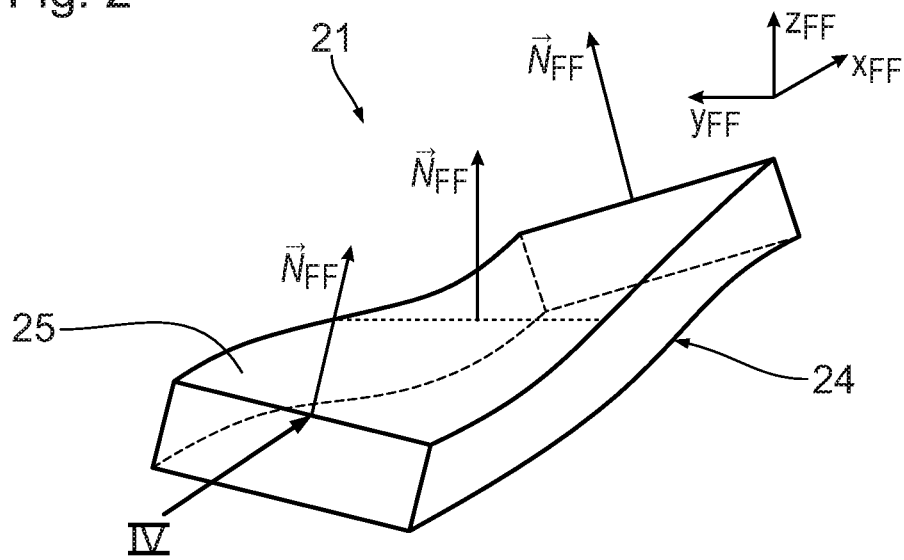
FIG. 3 shows, in a representation similar to FIG. 2, an instantaneous position of the base body that is twisted in comparison with FIG. 2, with three normal vectors additionally being illustrated on the reflection surface.

FIG. 3 shows, by way of example, the result of a corresponding torsional effect due to the introduction of force along the force application vectors 26, which is implemented by an actuator device for which exemplary embodiments are described below.

By way of example, three normal vectors $\vec{N}_{FF}$ are shown on the reflection surface 25 in the region of a minimum $x_{FF}$-coordinate, a central $x_{FF}$-coordinate, and a maximum $x_{FF}$-coordinate of the reflection surface 25, in each case at a central $y_{FF}$-coordinate. Points at which the normal vectors $\vec{N}_{FF}$ emanate from the reflection surface 25 are located on a straight line parallel to the $x_{FF}$-coordinate.

Figure 4:
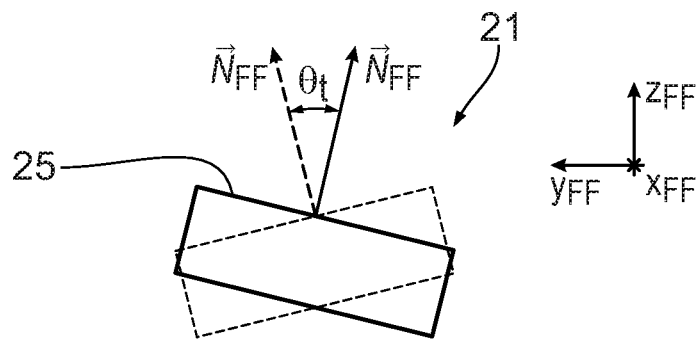
FIG. 4 shows a twisted field facet base body according to FIG. 3, as seen from viewing direction IV in FIG. 3.

FIG. 4 illustrates the effect of reflection surface torsion in an end view of field facet 21, as seen along the positive $x_{FF}$-coordinate. An edge contour of an end face of the base body 24 facing the viewer is illustrated using solid lines in FIG. 4 and the edge contour of an end face of the base body 24 of the field facet 21 facing away from the viewer is illustrated using dashed lines. There is a maximum torsion angle $\theta_t$ between the normal vectors $\vec{N}_{FF}$ on the reflection surface 25 firstly level with this end face facing the viewer and secondly level with the end face of the base body 24 facing away from the viewer.

An actuator device 27 is described below with reference to FIGS. 5 to 9, the actuator device being used to deform the reflection surface 25 of the field facet 21 in two independent deformation degrees of freedom, specifically, firstly, in a torsion degree of freedom KM corresponding to what was explained above in connection with FIGS. 2 to 4, and, secondly, in a further deformation degree of freedom $\kappa_x$ for changing a curvature of the reflection surface 25 along the primary curvature coordinate $x_{FF}$.

Figure 7:
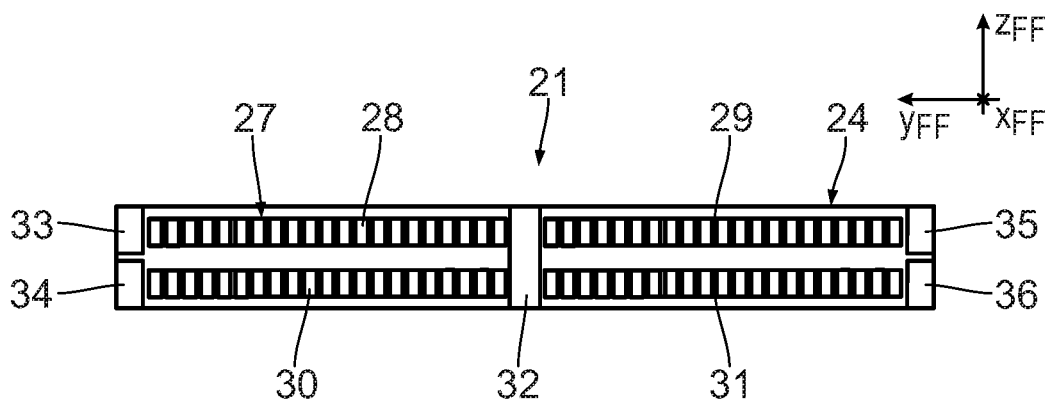
FIG. 7 shows a bottom view of the field facet according to FIG. 5, as seen from viewing direction VII in FIG. 6.

The actuator device has a total of four actuator units 28, 29, 30, 31, which are arranged in the form of a 2×2 matrix on a back side of the field facet 21, that is to say behind the reflection surface 25. The two actuator units 28, 30 shown on the left in FIG. 7 are supported between a back-side central web 32 of the facet base body 24 and respectively one back-side edge web 33, 34 of the base body 24. The two actuator units 29, 31 on the right in FIG. 7 are supported firstly on the central web 32 and secondly on a respective back-side edge web 35, 36 of the field facet base body 24 respectively opposite to the edge webs 33, 34.

The actuator units 28 to 31 of the actuator device 27 are embodied as piezo-elements in the form of piezo-stacks. A main force direction of the respective actuator unit 28 to 31 runs along the facet coordinate $x_{FF}$, that is to say parallel to the undeformed planar reflection surface 25.

The four actuator units 28 to 31 can be actuated independently of one another via a central open-loop/closed-loop control device (not shown here).

Figure 5:
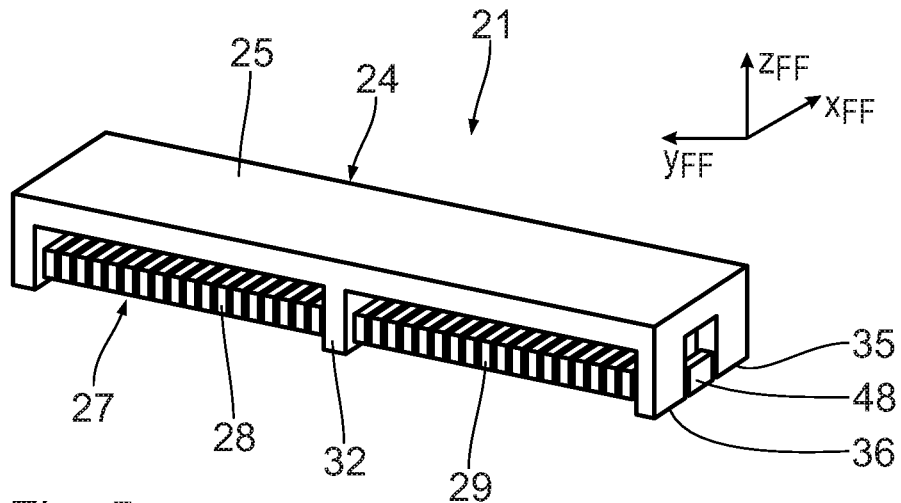
FIG. 5 shows a perspective view of a field facet with an actuator device, having four actuator units which are arranged in the form of a 2×2 matrix behind the reflection surface of the field facet, with only two of the four actuator units being visible in FIG. 5.
Figure 6:
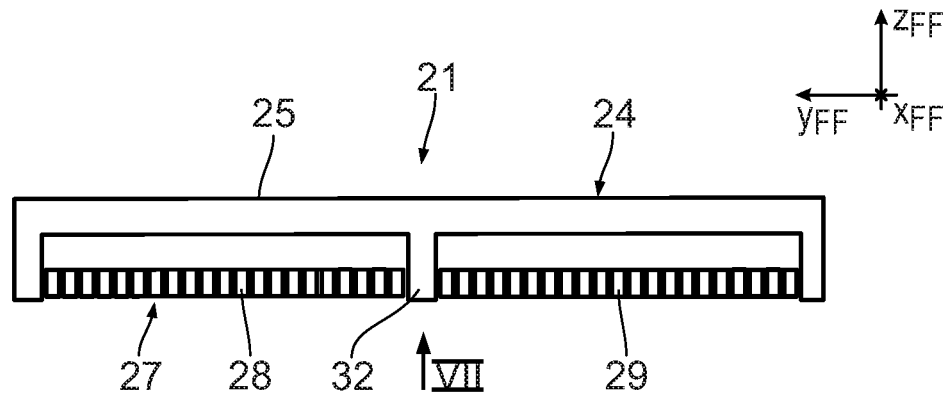
FIG. 6 shows a side view of the field facet according to FIG. 5.

FIGS. 5 to 7 show the actuator units 28 to 31 in their respective non-actuated initial positions, which yield the undeformed, for example planar reflection surface 25. As an alternative to the situation in which the undeformed reflection surface 25 represents a planar surface, the undeformed reflection surface 25 may also already be present as a curved surface in the non-actuated initial position.

Figure 8:
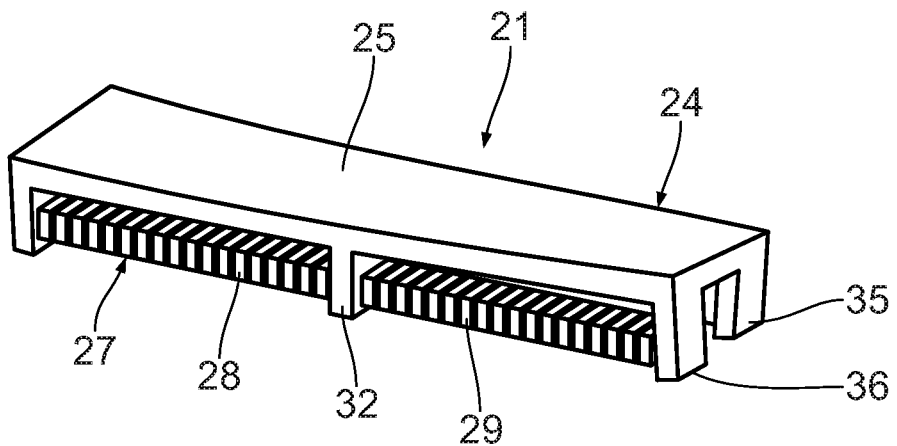
FIG. 8 shows, in a representation similar to FIG. 5, the field facet according to FIG. 5 with an actuator unit controlled to generate a torsion of the reflection surface.

FIG. 8 shows a torsional deformation of the reflection surface 25, that is to say a torsion of the reflection surface 25 about the primary curvature coordinate $x_{FF}$. The actuator units 29 and 30 (the latter not visible in FIG. 8) of the actuator device 27 are actuated to this end and, in comparison with their rest state, have expanded along the field facet coordinate $x_{FF}$. This results in a torsion (deformation degree of freedom $\kappa_M$) of the reflection surface 25 about the facet coordinate $x_{FF}$, that is to say about the primary curvature coordinate. By alternative control of the other two actuator units 28, 31, it is possible to bring about a torsion of the reflection surface 25 in the opposite direction, that is to say through a torsion angle $\theta_t$ with the opposite sign.

Figure 9:
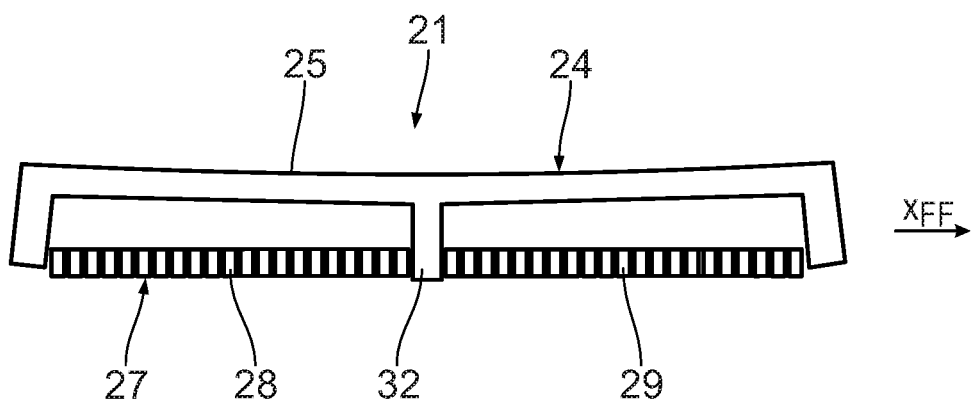
FIG. 9 shows, in a representation similar to FIG. 6, the field facet according to FIG. 5 with actuator units controlled to generate a curvature of the reflection surface along a primary curvature coordinate.

FIG. 9 shows, by way of example, a deformation of the reflection surface in the second deformation degree of freedom $\kappa_x$, specifically a change in a curvature of the reflection surface 25 along the primary curvature coordinate $x_{FF}$. For this purpose, all four actuator units 28 to 31 of the actuator device 27 are controlled so as to expand via the open-loop/closed-loop control device. A concave curvature of the reflection surface 25 along the primary curvature coordinate $x_{FF}$ is the consequence.

By controlling the actuator units 28 to 31 in such a way that they pull together or contract in comparison with the initial position, it is possible to generate a convex curvature of the reflection surface 25 along the primary curvature coordinate $x_{FF}$.

Figure 10:
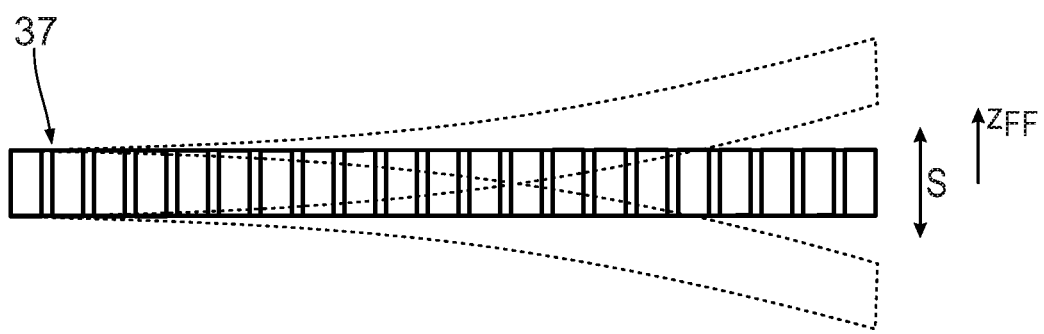
FIG. 10 shows a side view of an actuator unit which can be used as an alternative to the actuator units shown in FIGS. 5 to 9.

In an alternative embodiment of the actuator device 27, shear actuator units, for which a shear actuator unit 37 is shown in FIG. 10 by way of example, are used instead of the length-variable actuator units 28 to 31. The shear actuator unit 37 is in turn embodied as a piezo-stack, with the individual piezo-layers of the piezo-stack, when controlled by the open-loop/closed-loop control unit, shearing with respect to one another along a shear coordinate S, which is parallel to the field facet coordinate $z_{FF}$. Two extreme shear positions of the shear actuator unit 37 are shown in FIG. 10 using dashed lines.

In an embodiment of the actuator device of at least one corresponding shear actuator unit 37, the latter can be attached, for example, at the location of the actuator units 28 to 31 of the embodiment according to FIGS. 5 to 9 and can be extensively connected to a back side of the field facet base body 24 opposite to the reflection surface 25. A bending effect of the shear actuator units 37 is transferred directly to the shape of the reflection surface 25. This can then be used, for example, to generate a force application corresponding to the force application vectors 26 according to FIG. 2 for generating a torsion of the reflection surface 25. By shearing all four shear actuator units 37 in parallel, a convex or concave curvature of the reflection surface 25 can in turn be generated, corresponding to what was explained above in connection with FIG. 9.

Figure 11:
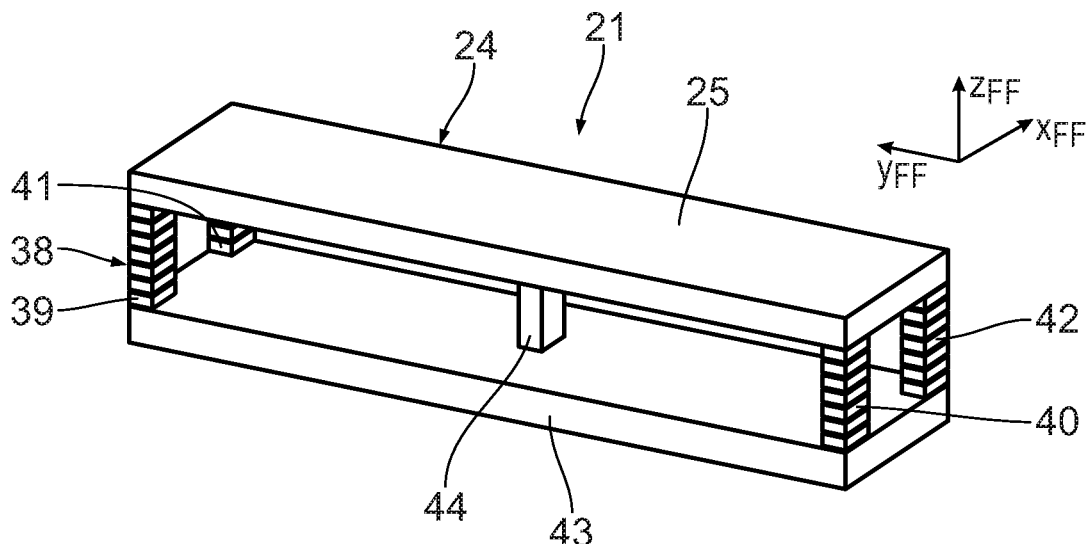
FIG. 11 shows, in a representation similar to FIG. 5, a field facet with an actuator device having four actuator units which are each arranged behind the reflection surface in the region of the contour corners of the reflection surface.

A further embodiment of an actuator device 38 is described below with reference to FIGS. 11 and 12, which further embodiment can be used instead of the actuator device 27 according to FIGS. 5 to 9 or instead of the actuator device with the shear actuator units 37. Components and functions corresponding to those which have already been explained above with reference to FIGS. 1 to 10 have the same reference signs and will not be discussed in detail again.

The actuator device 38 once again has four actuator units 39, 40, 41, and 42, which are arranged, once again, in the form of a 2×2 matrix on the back side of the base body of the field facet 21, that is to say behind the reflection surface 25. In this case, the four actuator units 39 to 42 are arranged at the four corners of the edge contour of the reflection surface 25. Once again, the actuator units 39 to 42 are embodied as piezo-elements in the form of piezo-stacks. Unlike in the embodiment according to FIGS. 5 to 9, a main force direction of the actuator units 39 to 42 runs perpendicularly to the reflection surface 25, that is to say in the direction of a field facet coordinate $z_{FF}$, in the case of the actuator device 38. The actuator units 39 to 42 are supported, firstly, on the back side of the base body 24 and, secondly, on a frame plate 43 of a frame of the field facet 21, the frame plate being arranged at a distance from the back side of the base body 24 and running parallel to the reflection surface 25. A central, rigid, strut-like support web 44 is arranged between the base body 24 and the frame plate 43 in the region of a center of the reflection surface 25, the base body 24 being securely connected to the frame plate 43 via the central, rigid, strut-like support web. A cross-sectional extent of the support web 44 along the two facet coordinates $x_{FF}$, $y_{FF}$ is typically the same and less than the extent of the reflection surface 25 along the facet coordinate $y_{FF}$, which is also referred to as the perpendicular coordinate.

Figure 12:
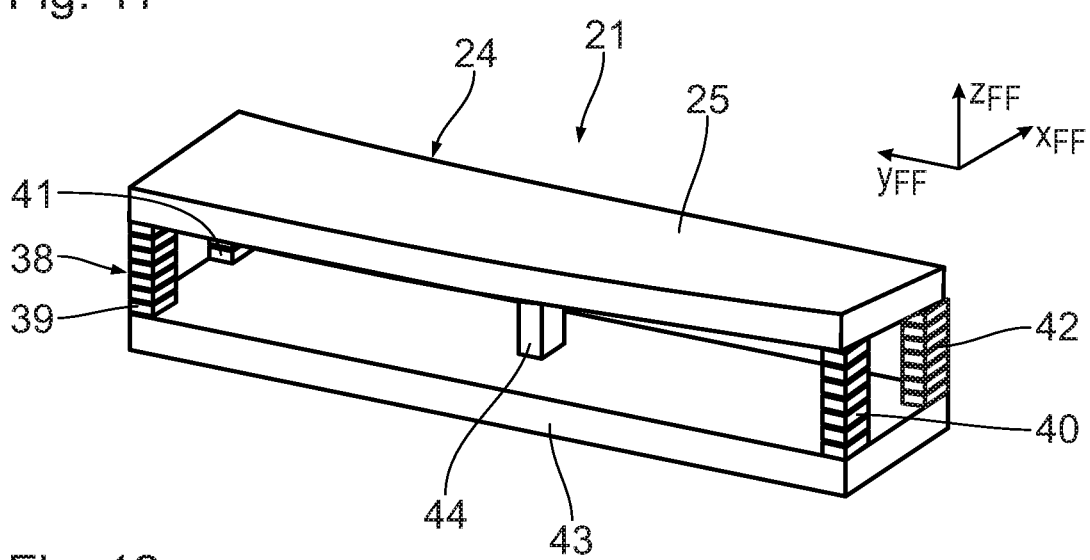
FIG. 12 shows, in a representation similar to FIG. 11, the field facet according to FIG. 11 with actuator units controlled to generate a torsion of the reflection surface.

FIG. 12 shows, by way of example, a torsional deformation of the reflection surface 25 in the manner of the deformation that has already been explained above in connection with FIGS. 3, 4 and 8. This torsional deformation is achieved by expansion actuation of the actuator units 40, 41, with the two other actuator units 39, 42 being able to be controlled to contract in order to increase the torsion angle. A torsion with the opposite torsion angle sign can be achieved by controlling the actuator units 39 to 42 in the equal but opposite sense.

A concave curvature of the reflection surface 25 along the primary curvature coordinate can in turn be achieved by expansion control of all actuator units 39 to 42, as explained above with reference to FIG. 9. A convex curvature of the reflection surface 25 along the primary curvature coordinate $x_{FF}$ can also be achieved by contracting all four actuator units 39 to 42.

With reference to FIGS. 13 to 16, a description is given below of a further embodiment of an actuator device 45, which can be used instead of the actuator device 38. Components and functions which were already explained above, especially in connection with the embodiment according to FIGS. 11 and 12, have the same reference signs and will not be discussed in detail again.

In contrast to the strut-like support web 44, the actuator device 45 has a support wall 46, which extends over the entire extent of the reflection surface 25 along the perpendicular coordinate $y_{FF}$. The reflection surface 25 is therefore securely connected to the frame plate 43 over its entire $y_{FF}$-extent in the region of its center, that is to say at a central $x_{FF}$-coordinate. This ensures that, independently of a torsion or curvature, the reflection surface 25 has an uncurved profile along the perpendicular curvature coordinate $y_{FF}$ in the region of central $x_{FF}$-coordinates. This undeformed reflection surface section $25_0$ is indicated in FIG. 15 by dashed boundary lines.

Figure 13:
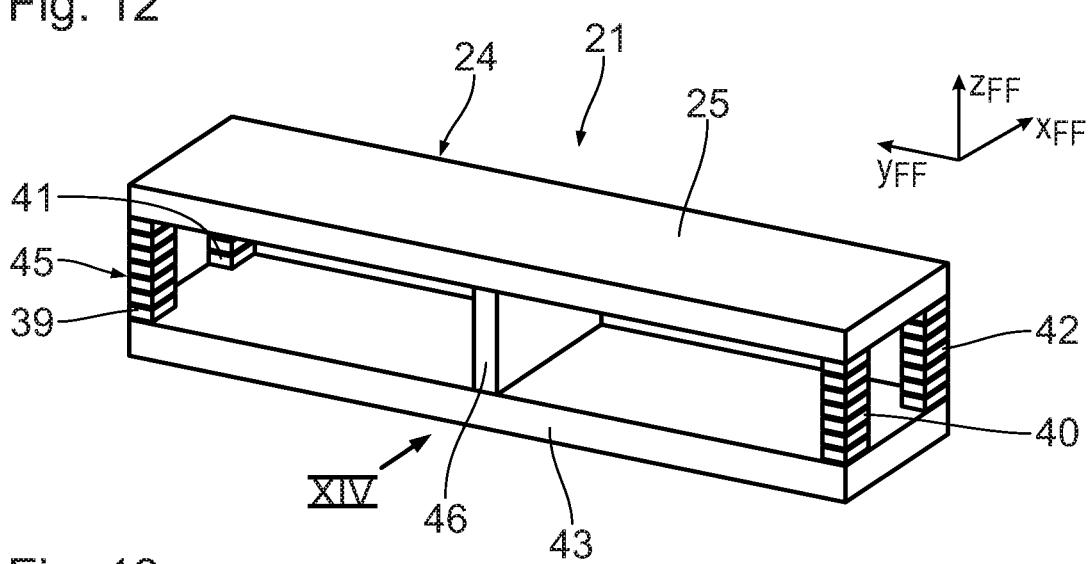
FIG. 13 shows, in a representation similar to FIG. 11, a field facet with four actuator units which are arranged in the corners behind the reflection surface.

FIG. 13 shows the actuator device 45 with the actuator units 39 to 42 in the undeformed initial position.

Figure 14:
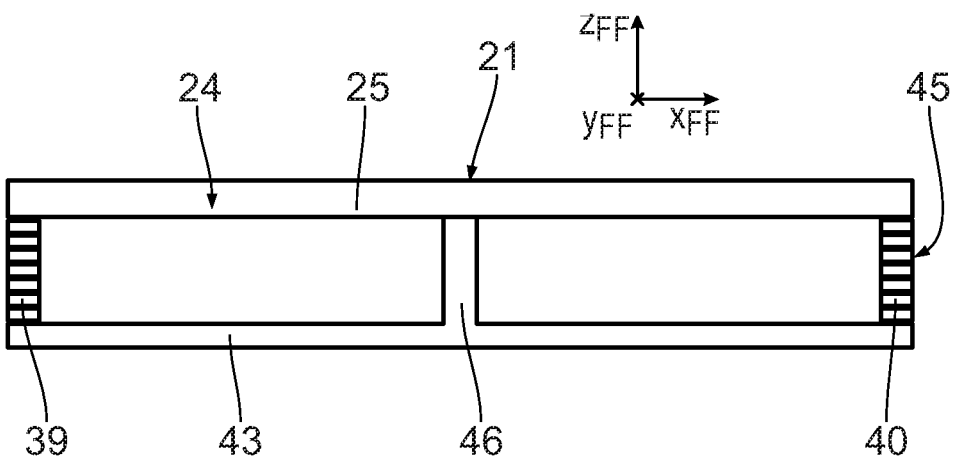
FIG. 14 shows a side view of the field facet according to FIG. 13, as seen from viewing direction XIV.

FIG. 14 shows a side view of the field facet 21 with the actuator device 45 in this undeformed initial position.

Figure 15:
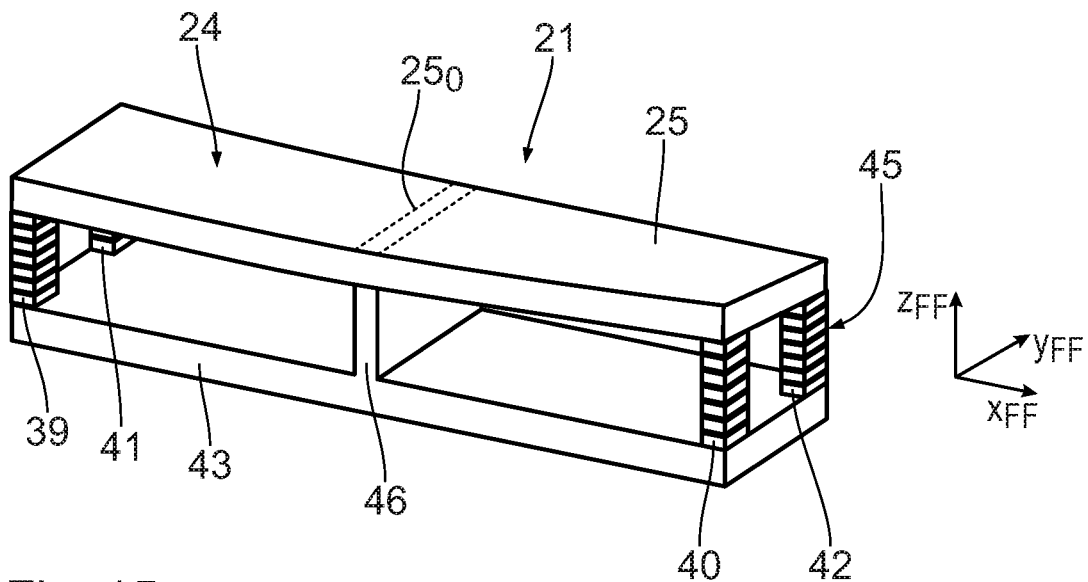
FIG. 15 shows, in a representation similar to FIG. 13, the field facet according to FIG. 13 with actuator units controlled to generate a torsion of the reflection surface.

FIG. 15 shows the actuator device 45 in a torsional deformation position of the reflection surface 25 which corresponds to the torsional deformation position, for example according to FIGS. 8 and 12.

Figure 16:
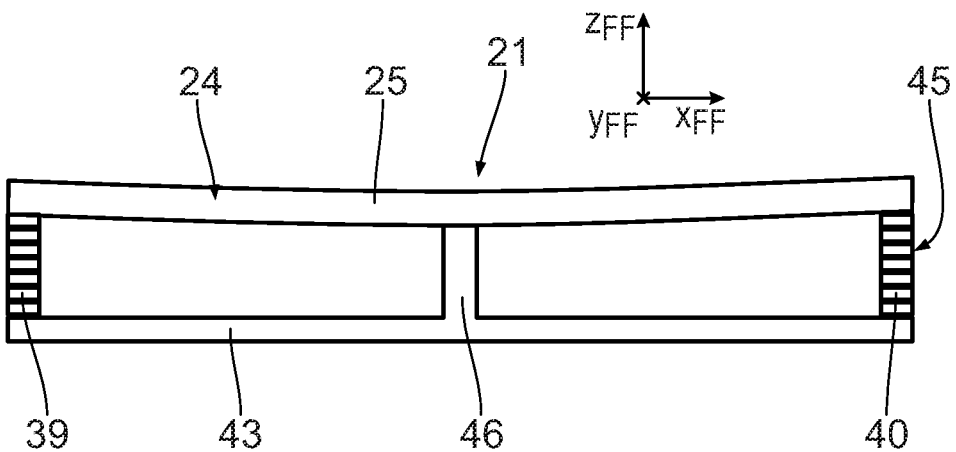
FIG. 16 shows, in a representation similar to FIG. 14, the field facet according to FIG. 13 with actuator units controlled to generate a curvature along the primary curvature coordinates.

FIG. 16 shows the actuator device 45 in a curvature deformation position along the primary curvature coordinate $x_{FF}$, corresponding to what has already been explained above in connection with FIG. 9 and with the actuator device 38.

Figure 17:
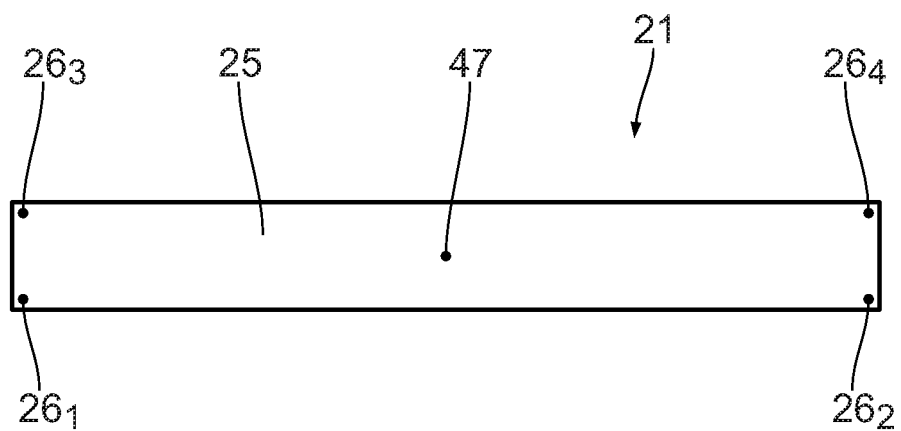
FIG. 17 shows a plan view of a first variant of the reflection surface of the field facet with a rectangular edge contour.

FIG. 17 shows a plan view of the reflection surface 25 with a rectangular edge contour, with force application points $26_1$ to $26_4$ corresponding to the points of application of the force application vectors 26 according to FIG. 2 and a counterforce point 47 in the center of the reflection surface 25, that is to say the force application point of the support web 44 or the support wall 46, being emphasized.

Figure 18:
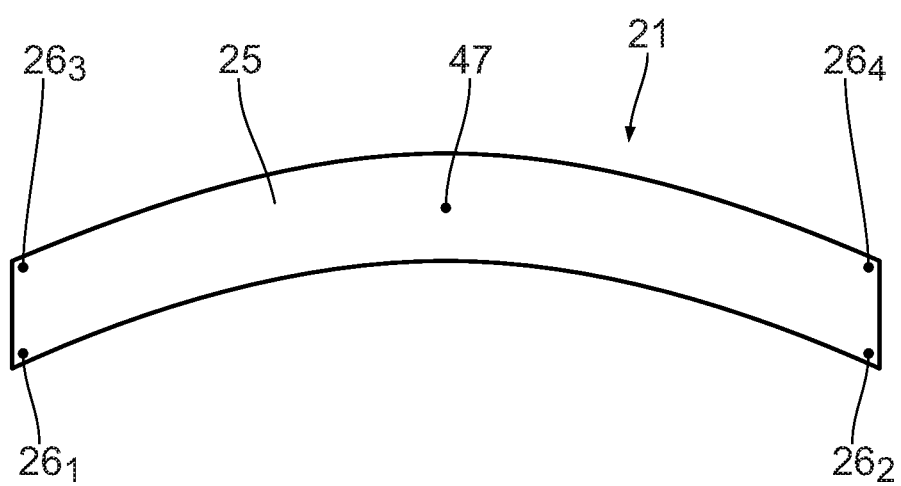
FIG. 18 shows a plan view similar to FIG. 17 of a further variant of the reflection surface with a curved edge contour.

FIG. 18 in turn shows a plan view of a variant of the reflection surface 25 with a curved edge contour, with the force application points 26; and the counterforce point 47 likewise being emphasized here.

As an alternative to the embodiment of the actuator units as a piezo-element, selected or all of the actuator units of the above-described actuator devices may also be designed as voice coils, for example.

The above-described actuator devices may have at least one further independently controllable actuator unit for deforming the reflection surface 25 in at least one third independent deformation degree of freedom, for example for changing a curvature of the reflection surface 25 along the perpendicular curvature coordinate $y_{FF}$.

To this end, for example in the embodiment of the actuator device 27 according to FIGS. 5 to 9, further actuator units can be arranged between the edge webs 33 and 34 and between the edge webs 35 and 36, which further actuator units, for example, once again have a main force direction parallel to the undeformed reflection surface 25 along the perpendicular curvature coordinate $y_{FF}$. Such an actuator unit is indicated by way of example at 48 in FIG. 5. When these actuator units expand, this results in a concave curvature of the reflection surface 25 along the perpendicular curvature coordinate $y_{FF}$ and a contraction results in a convex curvature of the reflection surface 25 along the perpendicular curvature coordinate $y_{FF}$.

An effect of the above-described actuation of a deformation of the reflection surface 25 in at least two or three mutually independent deformation degrees of freedom, specifically, firstly, a torsional deformation and, secondly, a curvature deformation at least along the primary curvature coordinate, is described below. An ideal image representation of the intermediate focus IF on the pupil facet 23 respectively assigned to a field facet 21 via an illumination channel occurs, for example, when both the intermediate focus IF and the pupil facet 23 respectively under consideration are located at the foci of an ellipsoid.

Figure 19:
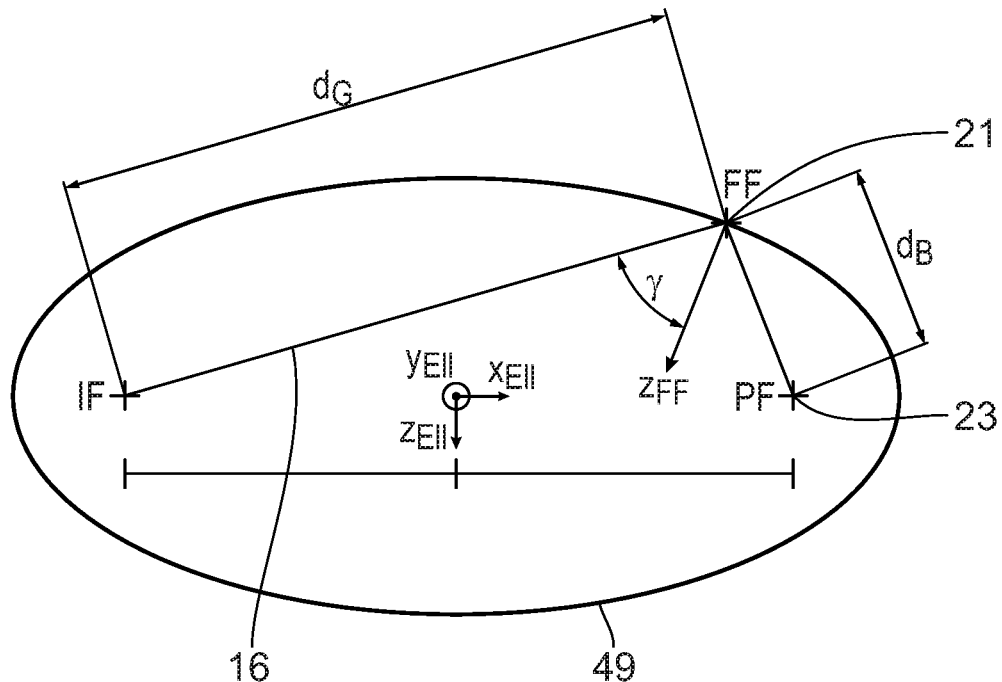
FIG. 19 shows a schematic representation of the position of an intermediate focus, of a field facet, and of a pupil facet in order to illustrate positional conditions for the generation of an ideal image representation of the intermediate focus on the pupil facet.

This is illustrated schematically in FIG. 19. In this case, the field facet 21 represents a section of an ideal ellipsoid 49. $d_G$ (object distance) denotes a distance between the intermediate focus IF and the field facet 21 respectively under consideration. $d_B$ (image distance) denotes a distance between the field facet 21 and the pupil facet 23 assigned thereto via the illumination channel. An angle of incidence of the EUV radiation 16 of the illumination channel on the field facet 21 is denoted by γ. A plane of incidence of the EUV radiation 16 upon reflection at the field facet 21, which coincides with the plane of the drawing in FIG. 19, is located in an xz-plane of a Cartesian coordinate system $x_{EII}y_{EII}z_{EII}$ of the ellipsoid 49.

The geometric centroid between the intermediate focus IF and a selected point, specifically the geometric centroid, on the pupil facet 23 serves as an exemplary origin for the coordinate system of the ideal ellipsoid; cf. FIG. 19. The intermediate focus IF, together with the geometric centroid on the field facet 21 and the geometric centroid on the pupil facet 23, defines the xz-plane of the ellipsoid coordinate system. The $x(X_{EII})$-axis is oriented in such a way that the intermediate focus IF is on the negative semi-axis, and the geometric centroid on the pupil facet 23 is on the positive semi-axis. The $y(y_{EII})$-axis and the $z(Z_{EII})$-axes of the ellipsoidal coordinate system are oriented so that, together with the x-axis of the latter, they form a right-handed coordinate system, with the geometric centroid on the field facet 21 being in the half-space of negative z-values. A surface normal at the geometric centroid on the reflection surface 25 of the field facet 21 runs along the $z_{FF}$-coordinate axis.

Instead of the geometric centroid, it is also possible to use a point to define the above coordinates, for example when using a field facet 21 with a reflection surface 25 with a curved edge contour, the x-coordinate of which point corresponds to that of the geometric centroid and the y-axis of which point, deviating from the geometric centroid in the center of the reflection surface 25 of the field facet 21, is located at the centroid x-coordinate. In the case of a field facet 21 with a rectangular reflection surface 25, firstly the geometric centroid and secondly the point constructed in this way coincide, but this does not hold true in the case of a field facet 21 with an arcuate reflection surface 25.

A selected chief ray of the EUV radiation 16 is shown in FIG. 19.

The $z_{FF}$-axis is oriented so that the intermediate focus IF and the geometric centroid of the pupil facet 23 are located in the half-space of positive $z_{FF}$-values. As already described above, the $x_{FF}$-axis runs in the direction of the long side of the reflection surface 25 and simultaneously represents the primary curvature coordinate. The $y_{FF}$-axis runs along the short side of the reflection surface 25 and simultaneously represents the perpendicular curvature coordinate.

Figure 20:
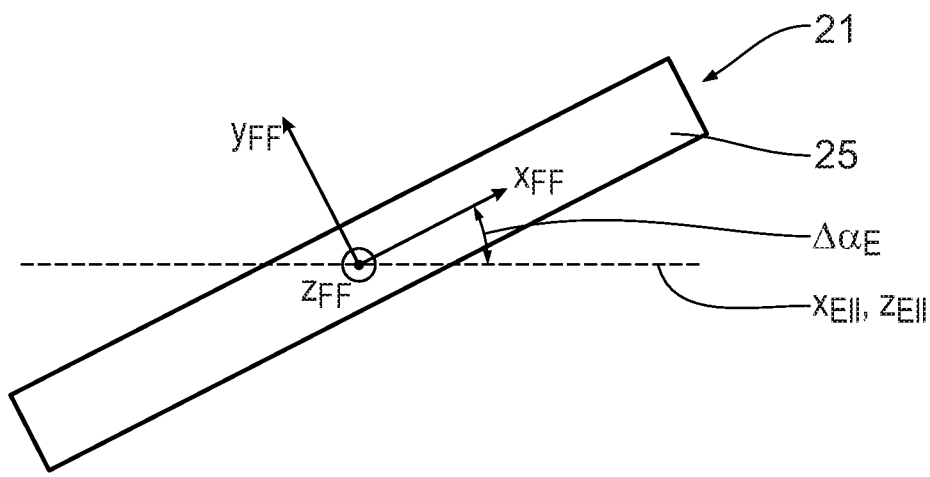
FIG. 20 shows a plan view of the reflection surface of the field facet together with a plane of incidence according to FIG. 19 in order to illustrate a coordinate system of the field facet.

FIG. 20 shows a position of the field facet 21 according to FIG. 19 relative to the plane of incidence $x_{EII}$, $z_{EII}$ of the ellipsoid 49. There is an angle $\Delta\alpha_E$ between the field facet coordinate $x_{FF}$ and this plane of incidence of the ellipsoid 49.

A quadratic approximation of the sagittal height z is sufficient to describe an ideal surface shape (sagittal height) of the reflection surface 25 of the field facet 21.

$$z = \frac{1}{\kappa}\left(1 - \sqrt{1-(\kappa x_0)^2}\right) \cong \frac{\kappa}{2}x_0^2 - \frac{\kappa^3}{8}x_0^4 \tag{1}$$

Here, κ is a curvature of the reflection surface 25 at the observed location of the reflection surface (unit [1/m]);

$x_0$ is a typical extent of a reflection surface segment under consideration.

Equation (1) describes a sagittal height z of a sphere. This equation is used to estimate an order of magnitude of an expected error, which arises from the quadratic approximation. The quartic order can be neglected. The quadratic order is considered.

Expressed in the coordinates $x_{FF}$, $y_{FF}$ the following relationship emerges for the ideal sagittal height $z_{id}$ of the reflection surface 25:

$$z_{id} \cong \frac{\kappa_x^{id}}{2}x_{FF}^2 + \frac{\kappa_y^{id}}{2}y_{FF}^2 + \kappa_M^{id}x_{FF}y_{FF} \quad (2)$$

In this case:

$\kappa_x^{id}$ is an ideal curvature of the reflection surface 25 along the primary curvature coordinate $x_{FF}$;

$\kappa_y^{id}$ is an ideal curvature of the reflection surface 25 along the perpendicular curvature coordinate $y_{FF}$;

$\kappa_M^{id}$ is a measure for an ideal torsion of the reflection surface 25.

The curvature or torsion parameters $\kappa$ of the above formula 2 depend on the curvatures of the ellipsoid 49, which in turn can be written as functions of the object distance do and the image distance de and the angle of incidence $\gamma$, and on the angle $\Delta\alpha_E$, which was explained above in connection with FIG. 20.

Ultimately, the following follows for the direction of the ideal surface normal depending on the curvature and torsion parameters $\kappa$:

$$\vec{N}_{id} \cong \begin{pmatrix} 0 \\ 0 \\ 1 \end{pmatrix} - \begin{pmatrix} \kappa_x^{id} + \text{sign}(x)\varepsilon_R\kappa_M^{id} \\ \kappa_M^{id} + \text{sign}(x)\varepsilon_R\kappa_y^{id} \\ 0 \end{pmatrix} x \quad (3)$$

Here it holds true that:

$\varepsilon_R = X_0/2R$, where R is the contour radius in the case of a curved field facet, that is to say, for example, the radius of curvature of the edge contour that emerges from the plan view according to FIG. 18.

The diameter of a point spread function is shown in each case as a measure of the imaging quality, for which a scale bar is shown on the right in the respective FIGS. 21 to 24.

Figure 21:
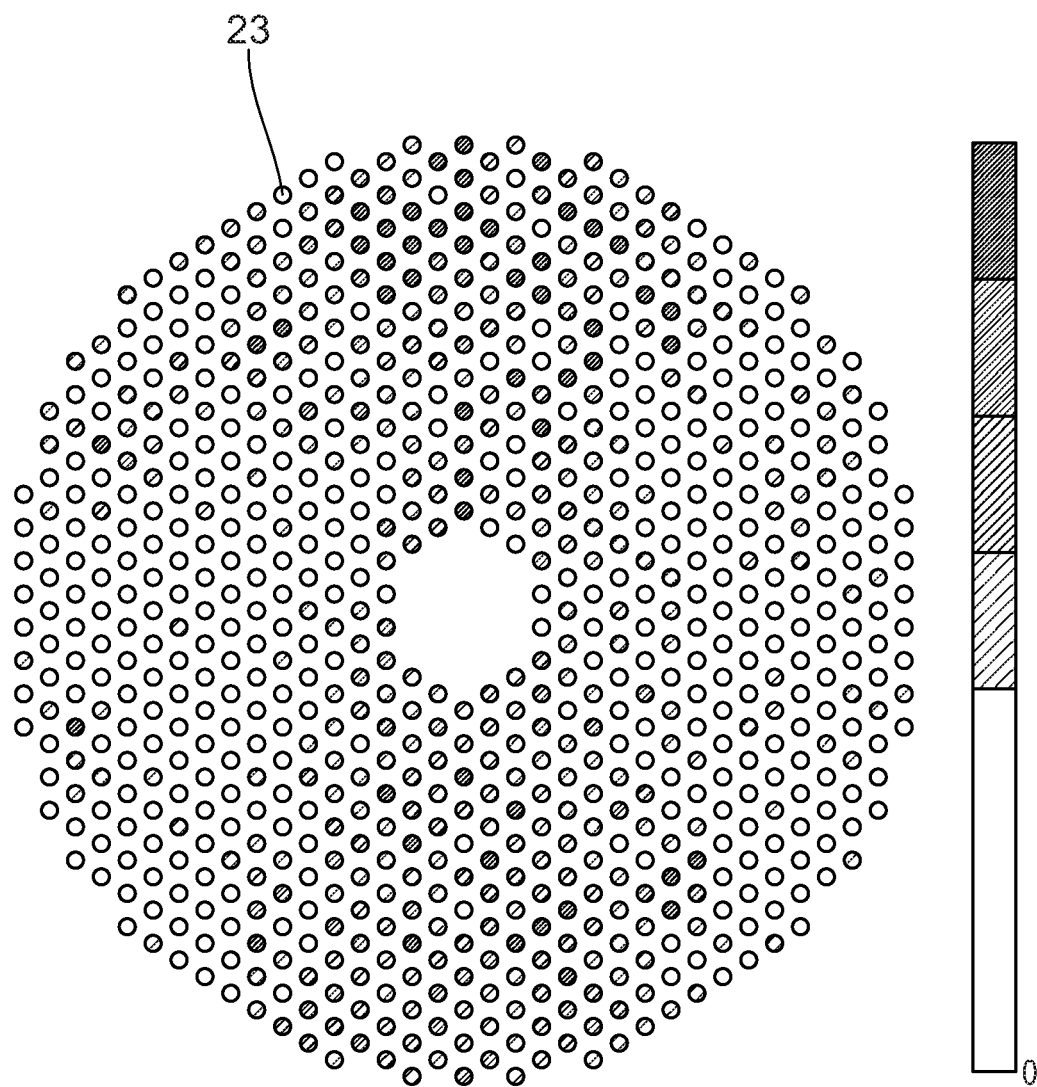
FIG. 21 schematically shows a plan view of a pupil facet configuration of a pupil facet mirror of the projection exposure apparatus according to FIG. 1, with the point spread function (PSF) as a measure of the imaging quality of the intermediate focus for a specific illumination setting at the location of the various pupil facets being emphasized by different hatching of the pupil facets, in an initial state of the field facet mirror, with, however, no actuator unit of the actuator devices of the field facet being actively controlled and the reflection surfaces of the field facets therefore being in the initial state.

What emerges from the sequence of FIGS. 21 to 24 is the improvement in quality of the image representation of the intermediate focus IF on the respective pupil facets 23 for a specific illumination setting, that is to say a specific illumination channel assignment between the field facets 21 and the pupil facets 23, depending on a deformation optimization of the field facet reflection surfaces in the respective deformation degrees of freedom:

FIG. 21 shows the initial situation in which the field facets 21 have not yet been deformed for the purposes of optimizing the intermediate focus imaging.

Figure 22:
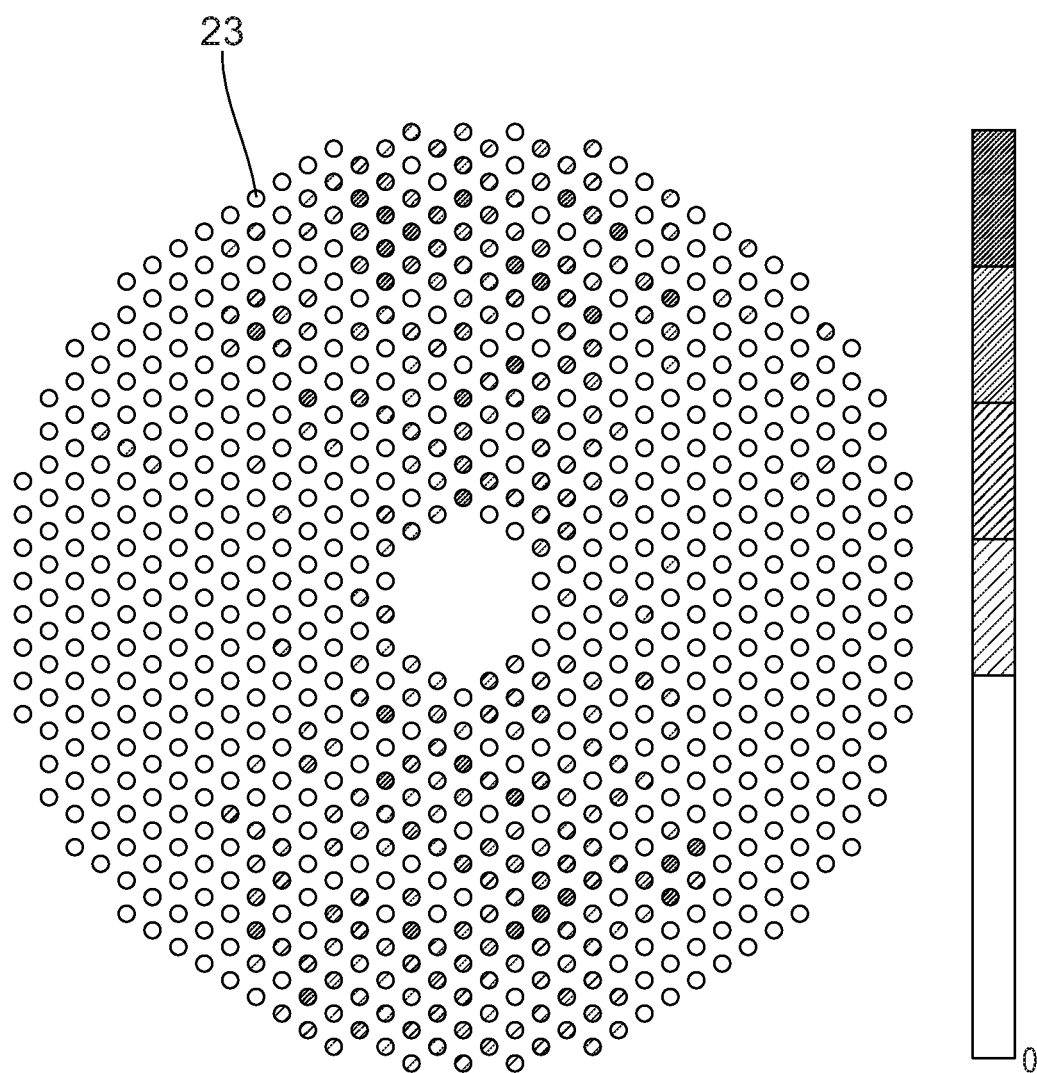
FIG. 22 shows, in a representation similar to FIG. 21, the imaging quality on the pupil facets, in which the actuator units of the actuator devices of the field facets are controlled to deform the field facet reflection surfaces in a first deformation degree of freedom, specifically to change the curvature of the reflection surfaces along the primary curvature coordinates.

FIG. 22 shows the situation in which a deformation was only generated in the first deformation degree of freedom $\kappa_x$, specifically a change in curvature $\kappa_x^{FF}$ of the reflection surface 25 along the primary curvature coordinate $x_{FF}$, and so the above condition (3) is satisfied with the least error as a result. There is a clear improvement in the imaging quality for a number of pupil facets 23, which results in a reduction in the diameter of the point spread function.

Figure 23:
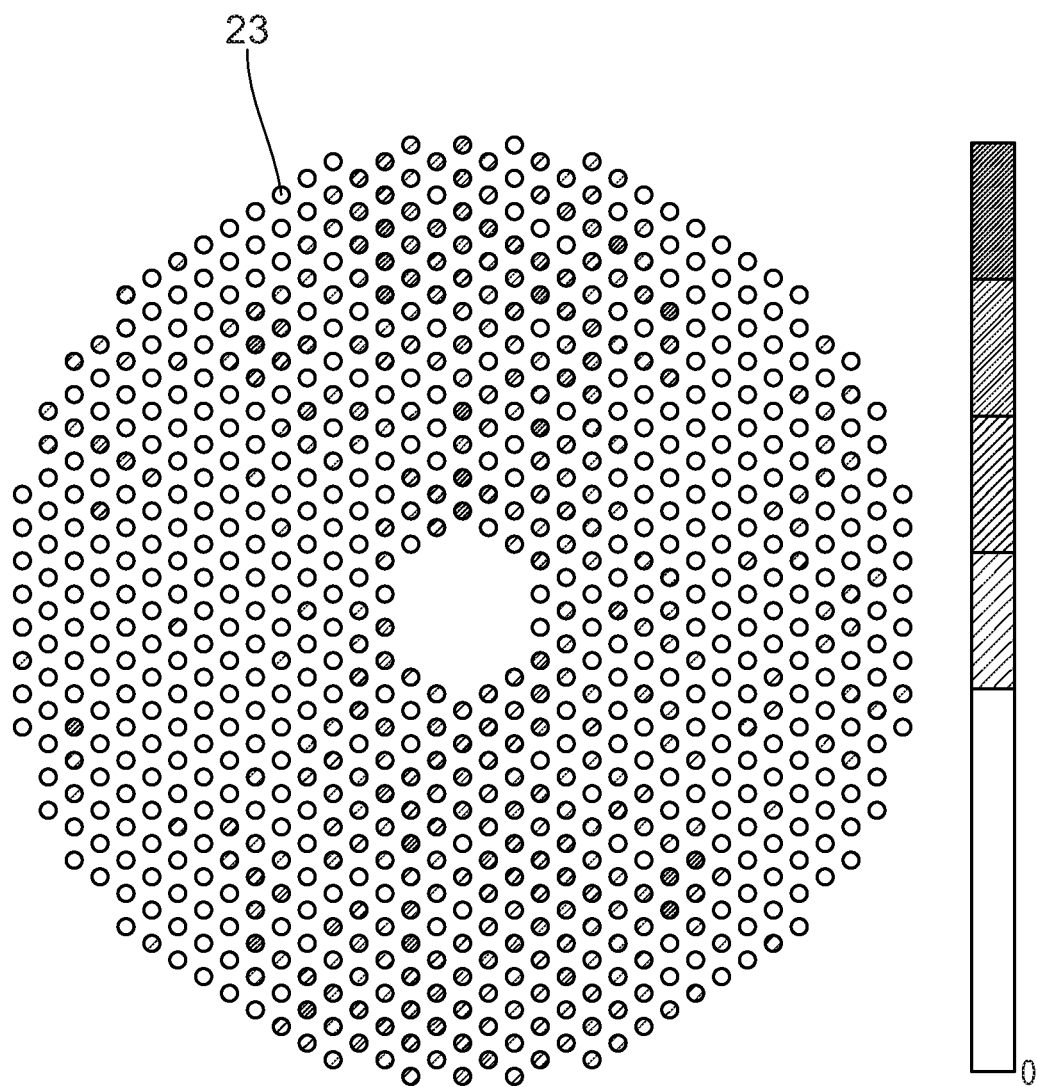
FIG. 23 shows, in a representation similar to FIGS. 21 and 22, the imaging quality on the pupil facets, in which, in addition to the deformation degree of freedom according to FIG. 22, the actuator units are controlled to deform the field facet reflection surface in a further deformation degree of freedom, specifically to change a curvature of the reflection surface along a perpendicular curvature coordinate.

In a representation comparable to FIG. 22, FIG. 23 shows the effect of an actuation only by curving the reflection surfaces 25 of the field facets 21 along the perpendicular curvature coordinate $y_{FF}$ (deformation degree of freedom $\kappa_y$). There is less of a correction effect in comparison with the curvature along the primary curvature coordinate.

Figure 24:
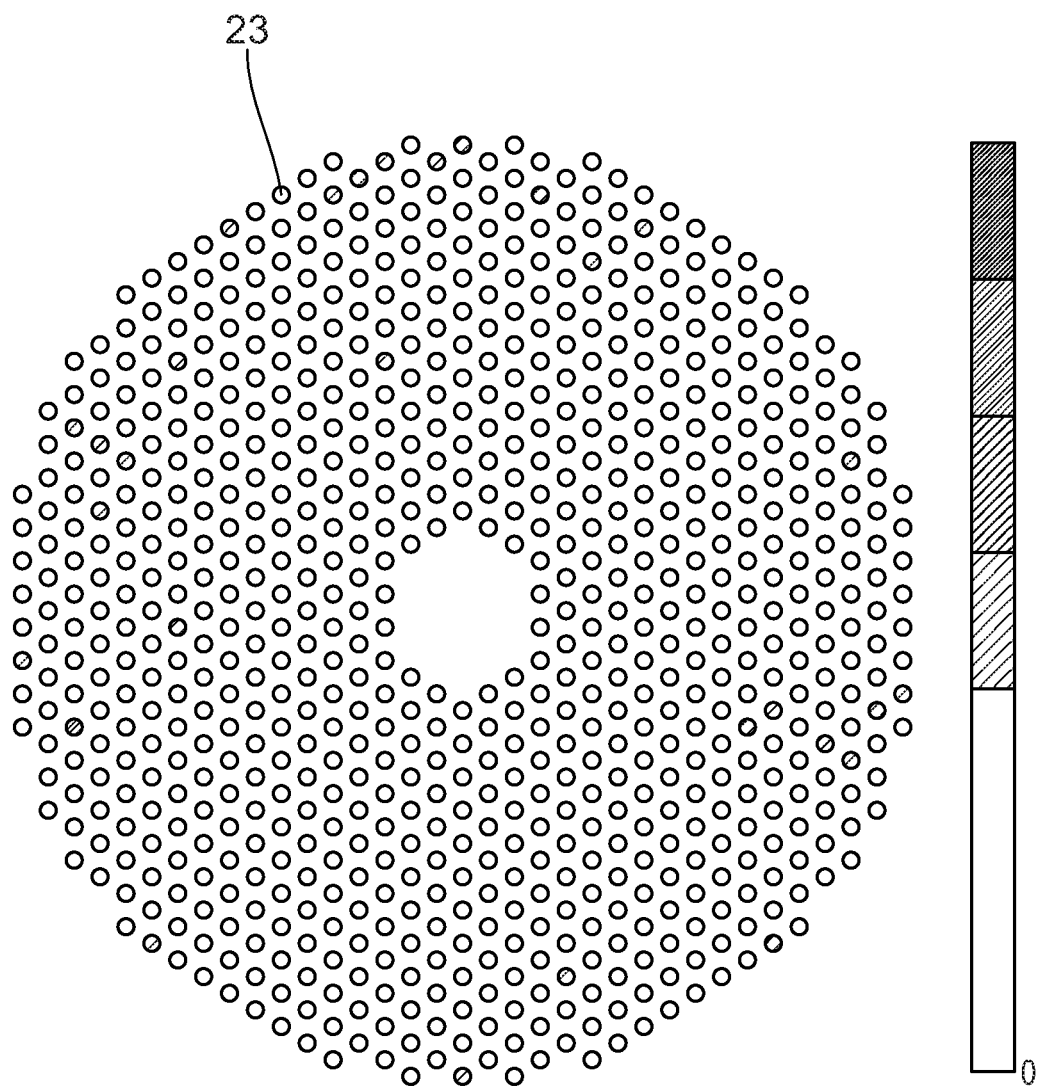
FIG. 24 shows, in a representation similar to FIGS. 21 to 23, the imaging quality on the pupil facets, wherein the actuator units of the field facets are controlled to deform the field facet reflection surfaces in a further independent deformation degree of freedom, specifically to change the torsion of the field facet reflection surfaces along the primary curvature coordinates.

FIG. 24 shows the effect of an actuation of only the torsion degree of freedom $\kappa_M$ of the reflection surfaces 25 of the field facets 21. The point spread function in FIG. 24 is so small for almost all pupil facets that a very good image representation of the intermediate focus on the respective pupil facet 23 is the result.

What is claimed is:

1. A field facet, comprising:
a reflection surface spanned by first and second field facet coordinates, the reflection surface configured to reflect illumination light;
an actuator device comprising first and second independently controllable actuator units configured to deform the reflection surface in a first deformation degree of freedom and in a second degree of freedom which is independent of the first deformation degree of freedom,
wherein:
the first deformation degree of freedom changes a curvature of the reflection surface along a primary curvature coordinate coinciding with the first field facet coordinate; and
the second deformation degree of freedom changes a torsion of the reflection surface about the primary curvature coordinate.

2. The field facet of claim 1, wherein:
the actuator device further comprises a third independently controllable actuator unit configured to deform the reflection surface in a third deformation degree of freedom which is independent of the first and second deformation degrees of freedom; and
the third deformation degree of freedom changes a curvature of the reflection surface along a curvature coordinate which is perpendicular to the primary curvature coordinate and which coincides with the other of the second field facet coordinate.

3. The field facet of claim 2, wherein:
the first actuator unit is supported on a back side of a facet base body of the field facet;
the first actuator unit is supported on a frame plate of a frame of the field facet;
the frame plate is a distance from a back side of the base body; and
a central support body is between the base body and the frame plate in a region of a center of the reflection surface; and
the base body is securely connected to the frame plate via the central support body.

4. The field facet of claim 3, wherein the first actuator units is supported between a back-side central web of a facet base body of the field facet and a back-side edge web of the base body.

5. The field facet of claim 4, wherein the first actuator unit comprises at least one member selected from the group consisting of a piezo-element and a voice coil.

6. The field facet of claim 5, wherein the first actuator unit comprises at least one member selected from the group consisting of a push actuator, a pull actuator, and a shear actuator.

7. The field facet of claim 6, wherein:
the actuator device further comprises third and fourth actuator units;
the first, second, third and fourth actuator units define a 2×2 matrix on back side of the field facet which is behind the reflection surface.

8. The field facet of claim 1, wherein:
the first actuator unit is supported on a back side of a facet base body of the field facet;
the first actuator unit is supported on a frame plate of a frame of the field facet;
the frame plate is a distance from a back side of the base body; and a central support body is between the base body and the frame plate in a region of a center of the reflection surface; and the base body is securely connected to the frame plate via the central support body.

9. The field facet of claim 1, wherein the first actuator units is supported between a back-side central web of a facet base body of the field facet and a back-side edge web of the base body.

10. The field facet of claim 1, wherein the first actuator unit comprises at least one member selected from the group consisting of a piezo-element and a voice coil.

11. The field facet of claim 1, wherein the first actuator unit comprises at least one member selected from the group consisting of a push actuator, a pull actuator, and a shear actuator.

12. The field facet of claim 1, wherein:
the actuator device further comprises third and fourth actuator units;
the first, second, third and fourth actuator units define a 2×2 matrix on back side of the field facet which is behind the reflection surface.

13. A mirror, comprising:
a plurality of field facets according to claim 1,
wherein the mirror is a field mirror.

14. A field facet assembly, comprising:
a field mirror comprising a plurality of field facets according to claim 1; and
an open-loop/closed-loop control device signal-connected to the actuator device.

15. An illumination optical unit, comprising:
a field facet assembly, comprising:
a field mirror comprising a plurality of field facets according to claim 1; and
an open-loop/closed-loop control device signal-connected to the actuator device; and
a transfer optical unit,
wherein:
the field fact assembly is configured to guide illumination light partial beams along an illumination light beam path into an object field; and
the transfer optical unit is configured to image the field facets into the object field with superposition.

16. The illumination optical unit of claim 15, further comprising a source configured to provide the illumination light.

17. An optical system, comprising:
an illumination optical unit; and
a projection optical unit,
wherein:
the illumination optical unit comprises a field facet assembly and a transfer optical unit;
the field facet assembly comprises:
a field mirror comprising a plurality of field facets according to claim 1; and
an open-loop/closed-loop control device signal-connected to the actuator device;
the field fact assembly is configured to guide illumination light partial beams along an illumination light beam path into an object field;
the transfer optical unit is configured to image the field facets into the object field with superposition; and
the projection optical unit is configured to image the object field into an image field.

18. The optical system of claim 17, further comprising a source configured to provide the illumination light.

19. An apparatus, comprising:
a source configured to provide illumination light;
an illumination optical unit; and
a projection optical unit,
wherein:
the illumination optical unit comprises a field facet assembly and a transfer optical unit;
the field facet assembly comprises:
a field mirror comprising a plurality of field facets according to claim 1; and
an open-loop/closed-loop control device signal-connected to the actuator device;
the field fact assembly is configured to guide illumination light partial beams along an illumination light beam path into an object field;
the transfer optical unit is configured to image the field facets into the object field with superposition;
the projection optical unit is configured to image the object field into an image field; and
the apparatus is a projection exposure apparatus.

20. A method of using a projection exposure apparatus comprising an illumination optical unit and a projection optical unit, the method comprising:
using the illumination optical unit to illuminate a reticle in an object plane; and
using the projection optical unit to image the reticle into an image plane,
wherein:
the illumination optical unit comprises a field facet assembly and a transfer optical unit; and
the field facet assembly comprises:
a field mirror comprising a plurality of field facets according to claim 1; and
an open-loop/closed-loop control device signal-connected to the actuator device.

* * * * *

UNITED STATES PATENT AND TRADEMARK OFFICE
CERTIFICATE OF CORRECTION

PATENT NO. : 12,372,883 B2
APPLICATION NO. : 18/170928
DATED : July 29, 2025
INVENTOR(S) : Stefan Lippoldt Page 1 of 2

It is certified that error appears in the above-identified patent and that said Letters Patent is hereby corrected as shown below:

In the Specification

Column 7, Lines 50-55, delete "The transfer optical unit may have exactly one mirror, or alternatively have two or more mirrors, which are arranged one behind the other in the beam path of the illumination optical unit 4. The transfer optical unit can for example comprise one or two normal-incidence mirrors (NI mirrors) and/or one or two grazing- incidence mirrors (GI mirrors)." and insert the same on Line 49, as a continuation of the same paragraph.

Column 8, Line 35, delete "(+/-0.25,/+-0.125)." and insert -- (+/-0.25, +/-0.125). --.

Column 10, Line 41, delete "KM" and insert -- $\kappa_M$ --.

Column 13, Line 19, delete "26;" and insert -- $26_i$ --.

Column 14, Line 8, delete "x($X_{EII}$)-axis" and insert -- x($x_{EII}$)-axis --.

Column 14, Line 11, delete "z($Z_{EII}$)-axes" and insert -- z($z_{EII}$)-axis --.

Column 15, Line 16, delete "do" and insert -- $d_G$ --.

Column 15, Line 16, delete "de" and insert -- $d_B$ --.

Column 15, Line 30, delete "$\varepsilon_R = X_0/2R$," and insert -- $\varepsilon_R = x_0/2R$, --.

Column 15, Line 44, delete "freedom:" and insert -- freedom. --.

In the Claims

Column 17, Line 39, in Claim 15, delete "fact" and insert -- facet --.

Signed and Sealed this
Ninth Day of September, 2025

Coke Morgan Stewart
*Acting Director of the United States Patent and Trademark Office*

CERTIFICATE OF CORRECTION (continued)
U.S. Pat. No. 12,372,883 B2

Column 18, Line 6, in Claim 17, delete "fact" and insert -- facet --.

Column 18, Line 28, in Claim 19, delete "fact" and insert -- facet --.